United States Patent [19]

Cavaliere et al.

[11] Patent Number: 4,991,138

[45] Date of Patent: Feb. 5, 1991

[54] HIGH SPEED MEMORY CELL WITH MULTIPLE PORT CAPABILITY

[75] Inventors: Joseph R. Cavaliere, Hopewell Junction, N.Y.; Alan K. Chan, Fort Lee, N.J.; Michel S. Michail, Wappingers Falls, N.Y.

[73] Assignee: International Business Machines Corporation, Armonk, N.Y.

[21] Appl. No.: 331,989

[22] Filed: Apr. 3, 1989

[51] Int. Cl.⁵ .................................... G11C 11/36
[52] U.S. Cl. ........................... 365/154; 365/190
[58] Field of Search ............. 365/154, 155, 156, 190; 307/563, 290, 292

[56] References Cited

U.S. PATENT DOCUMENTS

| | | | |
|---|---|---|---|
| 3,421,026 | 1/1969 | Stopper | 307/289 |
| 3,979,735 | 9/1976 | Payne | 365/154 |
| 4,070,656 | 1/1978 | Heuber et al. | 365/203 |
| 4,090,255 | 5/1978 | Berger et al. | 365/154 |
| 4,127,899 | 11/1978 | Dachtera | 365/154 |
| 4,280,197 | 7/1981 | Schlig | 365/154 |
| 4,412,312 | 10/1983 | Berger et al. | 365/154 |
| 4,415,991 | 11/1983 | Chu et al. | 365/77 |

FOREIGN PATENT DOCUMENTS

2305825 10/1976 France .

OTHER PUBLICATIONS

IBM Technical Disclosure Bulletin, vol. 22, No. 1, Jun. 1979, pp. 128–129, "Memory Cell Using Schottky Collector Vertical PNP Transistors", by N. G. Anantha et al.

IBM Technical Disclosure Bulletin, vol. 24, No. 1A, Jun. 1981, pp. 85–87, "Static Ram Cell with Selected Barrier Height Schottky Diodes", by B. A. Denis et al.

IBM Technical Disclosure Bulletin, vol. 26, No. 7B, Dec. 1983, pp. 3588–3589, "Multi–Port Ram Cell Structure", by M. N. Shen.

IBM Technical Disclosure Bulletin, vol. 27, No. 6, Nov. 1984, pp. 3450–3451, "Multi–Access Memory Cell", by S. K. Wiedmann.

*Primary Examiner*—Stuart N. Hecker
*Assistant Examiner*—Jack A. Lane
*Attorney, Agent, or Firm*—Jeffrey L. Brandt

[57] ABSTRACT

A semiconductor memory cell for selectively storing or outputting differential signals responsive to a SELECT signal supplied on a word line includes: a transistor pair having cross-coupled base-collector terminals and emitter terminals connected to a common reference potential; a sensing circuit connected to each of the base-collector terminals in the transistor pair, each of the sensing circuits including (a) a first diode having a cathode connected to the base-collector terminal, (b) a second diode having an anode connected to the anode of the first diode and a cathode connected to the word line, and (c) a circuit connected at the commonly connected anodes of the first and second diodes for amplifying the signal thereat; a writing circuit connected to each of the transistors in the transistor pair, the writing circuit including a transistor having a base connected to the word line and a collector connected to the base-collector terminal; and a circuit for supplying constant current to each of the base-collector terminals and to each of the commonly connected anodes of the first and second diodes. The memory cell permits read access or select while maintaining the voltages on the latch nodes stable.

14 Claims, 2 Drawing Sheets

HIGH SPEED MEMORY CELL WITH MULTIPLE PORT CAPABILITY

The present invention relates generally to data storage cells and more particularly to a highly stable storage cell adaptable to multiple port read/write access.

BACKGROUND OF THE INVENTION

Important characteristics of any data storage cell include the read/write times of the cell, or the time that it takes to read data out of and write data into the cell. While it is desirable to optimize, i.e. shorten, these read/write cycles or times, it is also important that the cell be capable of stably storing data. That is, the cell must be capable of storing data so that it is not disturbed during a selected read or write operation.

One well known circuit arrangement for a binary storage cell is the bistable latch, typically comprised of a pair of cross-coupled bipolar transistors connected in a bistable configuration. At any given time, the two transistors are alternatingly conducting and non-conducting, the particular transistor status determining the value of the stored binary data. Many different configurations of such bistable latches are known, each providing particular advantages and disadvantages.

The following publications show examples of data storage cells including cross-coupled bipolar transistors connected in a bistable latch arrangement: U.S. Pat. No. 3,421,026 to Stopper; IBM Technical Disclosure Bulletin, titled: "Memory Cell Using Schottky Collector Vertical PNP Transistors", Vol. 22, No. 1, June 1979; and IBM Technical Disclosure Bulletin, titled: "Static RAM Cell With Selected Barrier Height Schottky Diodes", Vol. 24, No. 1A, June 1981.

In prior art memory cells comprised of cross-coupled, bistable transistor pairs, a trade-off is typically encountered between speed and reliability. Memory cells of the type wherein the bistable latch transistors are maintained in a non-saturated state are typically fast, such cells avoiding the relatively longer times necessary to switch the transistors into and out of the saturation state. However, such memory cells are more prone to disturbance than is desirable, particularly during read/write operations.

The following publications show memory cells wherein cross-coupled bipolar transistors are operated in the non-saturation mode as bistable latches: U.S. Pat. No. 4,090,255 to Berger et al. (assigned to the assignee of the present invention); U.S. Pat. No. 3,979,735 to Payne; and U.S. Pat. No. 4,070,656 to Heuber et al. (assigned to the assignee of the present invention).

Memory cells of the type wherein the bistable latch transistors are operated in the saturation mode are typically more reliable than those operated in the non-saturation mode. These memory cells, however, often suffer from slow read and write times necessitated by the switching of the transistors into and out of the saturation state.

In addition to optimizing the speed versus reliability characteristics discussed above, further desirable in the operation of a memory cell is the ability to read and write that cell, i.e. a single bistable transistor pair, via a number of different "ports", or read/write address and data lines. Such a capability permits a memory array utilizing such cells to quickly and efficiently select multiple cells for parallel read/write operations.

The following publications show multiple port semiconductor memory devices: U.S. Pat. No. 4,412,312 to Berger et al. (assigned to the assignee of the present invention); U.S. Pat. No. 4,280,197 to Schlig (assigned to the assignee of the present invention); IBM Technical Disclosure Bulletin, titled: "Multi-Port RAM Cell Structure", Vol. 26, No. 7B, December 1983; U.S. Pat. No. 4,415,991 to Chu et al.; IBM Technical Disclosure Bulletin, titled: "Multi-Access Memory Cell", Vol. 27, No. 6, November 1984; and U.S. Pat. No. 4,127,899 to Dachtera (assigned to the assignee of the present invention).

SUMMARY OF THE INVENTION

The principle object of the present invention is to provide a new and improved data memory cell.

Another object of the present invention is to provide such a data memory cell for use in a static random access memory (SRAM).

Yet another object of the present invention is to provide such a data memory cell which provides fast read and write access times, a fast cycle time, and is relatively immune to disturbances during accessing.

A further object of the present invention is to provide such a data memory cell which accommodates multiple read and write ports while providing fast read, write, and cycle times, and is relatively immune to disturbances during accessing.

In accordance with the present invention, there is provided a new and improved semiconductor memory cell responsive to a SELECT signal on a wordline for outputting stored differential data signals, comprising: latching means for storing differential data, the latching means including a transistor pair having cross-coupled base-collector terminals connected to operate in a bistable mode such that the on transistor is saturated; and sensing means connected to each of the base-collector terminals in the transistor pair and responsive to the SELECT signal for sensing the stored differential data, the sensing means including (a) a first diode having a cathode connected to the base-collector terminal, and (b) a second diode having an anode connected to the anode of the first diode and a cathode connected to the word line; the stored differential data being sensed at the commonly connected anodes of the first and second diodes. In an embodiment shown below, the stored differential data is sensed through a current amplification transistor.

Writing means can also be provided such that the semiconductor memory cell is further responsive to the SELECT signal applied to the word line for writing differential data into the latch means. The writing means is connected to each of the base-collector terminals in the transistor pair, and includes a transistor having a base connected to the cathode of the second diode and a collector connected to the base-collector terminal.

Multiple sensing and writing means can be connected to the latch means so as to provide the memory cell with multiple sensing and writing ports.

BRIEF DESCRIPTION OF THE FIGURES

These and other objects, features, and advantages of the present invention will become apparent from a consideration of the following detailed description of the invention when considered in conjunction with the drawing Figures, in which.

DETAILED DESCRIPTION OF THE INVENTION

Figure 1:
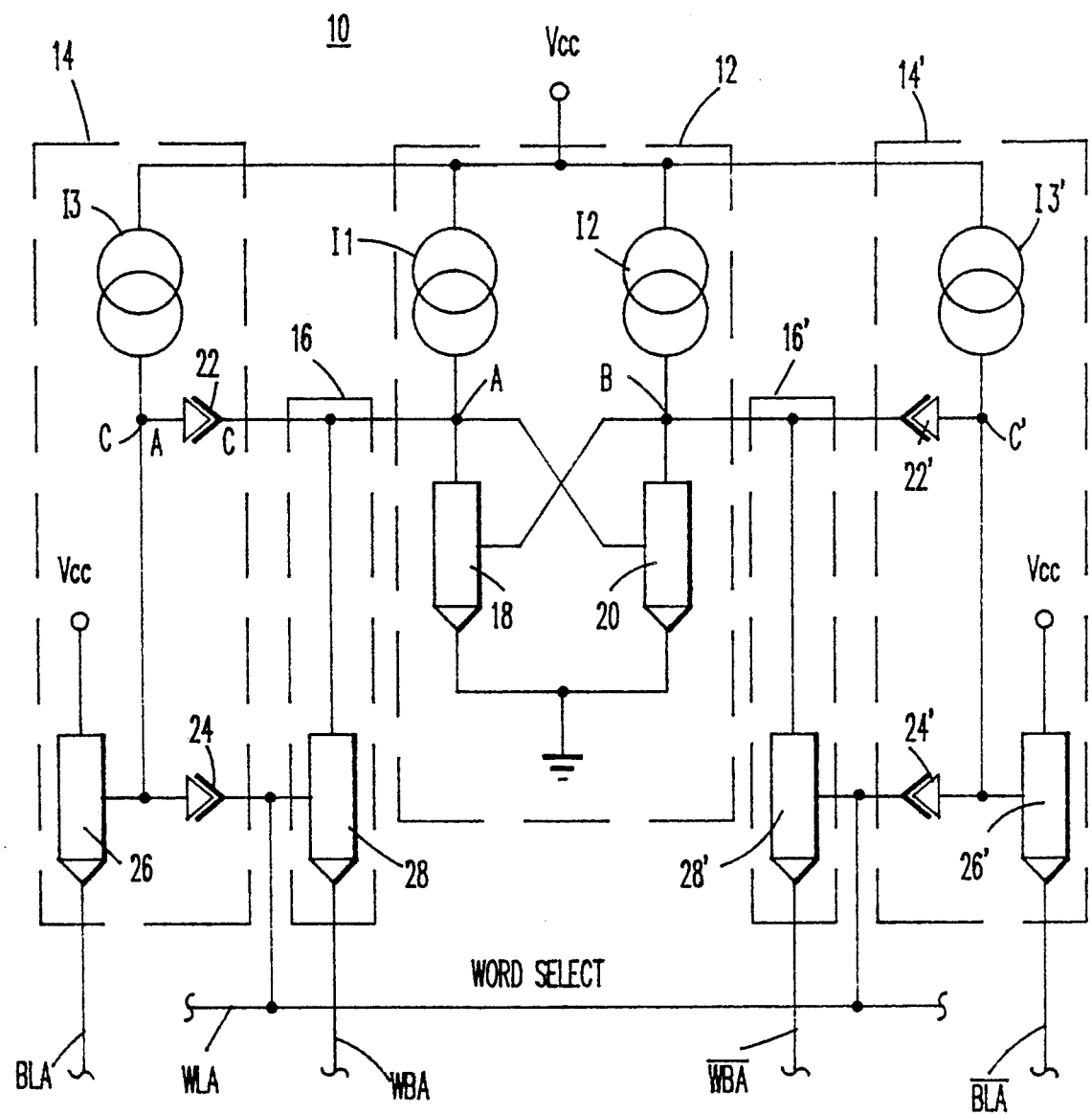
FIG. 1 shows a data memory cell constructed in accordance with the present invention.

Referring now to FIG. 1, a data memory cell 10 is shown including a bistable latch 12. Sense circuit 14, 14' is connected to latch 12 for selectively sensing data stored in the latch, and write circuit 6, 16' is connected to the latch for selectively writing data into the latch. A word line WLA is provided for applying a WORD SELECT signal to cell 10 so as to initiate a data read or write operation in a manner described in detail herein below.

Considering bistable latch 12, a pair of bipolar, NPN transistors 18, 20 are provided having cross-coupled base-collector terminals and emitter terminals connected to ground. The cross connection of the collector of transistor 18 with the base of transistor 20 is indicated at the circuit node A, and the cross connection of the base and collector of the corresponding transistors is indicated at the circuit node B. Constant current sources I1, I2 are connected between a supply voltage $V_{CC}$ and nodes A, B, respectively.

Considering sensing circuit 14, a first Schottky Barrier Diode (SBD) 22 is connected at its cathode to circuit node A. A second SBD 24 is connected at its anode to the anode of SBD 22, and at its cathode to word line WLA. The commonly connected anodes of SBDs 22, 24 are designated circuit node C.

An NPN bipolar transistor 26 is connected in an emitter-follower configuration having its collector connected to supply voltage $V_{CC}$, its base connected to circuit node C, and its emitter made available as a first bit line BLA. A constant current source I3 is connected between supply voltage $V_{CC}$ and circuit node C.

Sense circuit 14' is identical in construction to that of sense circuit 14, with like components being indicated by like, primed reference numbers, and the cathode of SBD 22' being connected to circuit node B. The cathode of SBD 24' is connected to word line WLA, and the emitter of transistor 26' is made available as a complementary bit sense line BLA-bar.

Considering now writing circuit 16, an NPN, bipolar transistor 28 is connected at its collector to circuit node A, at its base to word line WLA, and has its emitter terminal made available as a write bit line WBA. Writing circuit 16' is substantially identical in construction, including a transistor 28' having its collector connected to circuit node B, its base connected to word line WLA, and its emitter available as a complementary write bit line WBA-bar.

Figure 1A:
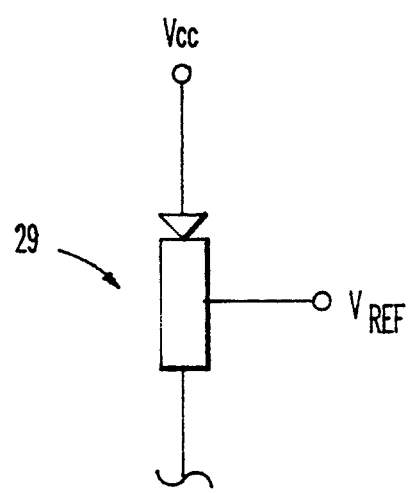
FIG. 1A shows a current source for use in the circuit of FIGS. 1 and 2.

In the preferred embodiment of the invention, each constant current source I1, I2, I3, I3' comprises a bipolar PNP transistor, such as transistor 29 shown in FIG. 1A, having its emitter connected to reference voltage $V_{CC}$ and its base connected to a reference voltage $V_{REF}$. In a manner known in the art, reference voltage $V_{REF}$ is selected to control the magnitude of the current sources.

In operation, the transistor pair 18, 20 comprising latch 12 functions as a bistable latch wherein the on or conducting transistor is driven in a saturated state. The voltages at circuit nodes A, B will, of course, always be differential in nature, the voltage at the collector of the saturated transistor being lower than the voltage at the collector of the off or non-saturated transistor. The WORD SELECT signal on word line WLA is kept normally low, except when it is raised high to initiate a read or write operation at memory cell 10. The contents of, i.e. differential data signals stored in, memory cell 10 are sensed at bit lines BLA, BLA-bar. If new data is to be written into memory cell 10, it is applied on write bit lines WBA, WBA-bar.

The standby, read, and write modes of operation for memory cell 10 will now be described in detail. It will be assumed for the sake of explanation that memory cell 10 starts with transistor 18 conducting and transistor 20 off.

Standby Operation

In the standby mode of operation the WORD SELECT signal on word line WLA is deselected (i.e. low). With transistor 18 conducting, the voltage at node B is relatively higher than the voltage at node A, and SBD 22' is back biased, or off. SBD 22 is forward biased, or on, and conducting current into node A. SBDs 24, 24' are also both on and conducting current into the word line WLA. The bases of transistors 26, 26' are at substantially identical potentials, and no voltage differential is developed between bit lines BLA, BLA-bar.

In accordance with an advantage of the present invention, a relatively low standby current, provided by current sources I1, I2, is required to maintain memory cell 10 in this standby mode of operation. This relatively low standby current results in correspondingly low power requirements.

Read Operation

In the read mode of operation, the WORD SELECT signal on word line WLA is raised high (i.e. the word line is selected), and currents are drawn from bit lines BLA, BLA-bar. With transistor 18 conducting, SBD 22 remains forward biased and SBD 24 becomes reversed biased. SBD 22' turns partially on, sharing the current delivered from source I3' with SBD 24', and causing a potential difference to quickly develop between bit lines BLA and BLA-bar.

In accordance with another advantage of the present invention, the operation of latch 12 in combination with select mechanism 14, 14' inhibits the WORD SELECT signal from changing the voltage at circuit nodes A, B, or at the emitters of latch transistors 18, 20. The voltages at these points stay stable to within several millivolts during the read operation, and the data stored in latch 12 is not prone to disturbance. Memory circuit 10 thus does not need recovery time to make it stable before it can be half-selected on the next cycle.

Write Operation

To effect a write into memory cell 10, the differential data to be written into the cell is applied across write bit lines WBA, WBA-bar. The WORD SELECT signal on word line WLA is raised high to select memory cell 10, and, depending on the polarity of the data on write bit lines WBA, WBA-bar, current is pulled out of one of transistors 28 or 28'. The latch transistor 18 or 20 having its collector connected to the transistor 28 or 28' from which current is pulled is switched to the conducting mode.

Assuming, for example, it is desired to write data such that transistor 20 is conducting, then the data is applied to the write bit lines WBA, WBA-bar so as to pull current out of transistor 28' and hence out of circuit node B. Because of the configuration of latch circuit 12, this will cause transistor 20 to enter saturation. The polarity of the signals on write bit lines WBA, WBA-bar are, of course, reversed if it is desired to drive transistor 18 into saturation.

In accordance with another advantage of the present invention, the provision of the two write transistors 28, 28' for selectively pulling current from either of nodes A or B results in a very fast write time and recovery after write. Further, the arrangement of latch circuit 12 such that it is fixed between the current sources I1, I2 and ground, and isolated from word line WLA by SBD gates 22, 22', 24, 24', isolated from bit lines BLA, BLA-bar by the SBD gates and emitter-follower transistors 26, 26', and isolated from the write bit lines WBA, WBA-bar by transistors 28, 28', provides very stable voltages at the circuit nodes in the latch circuit. This stability contributes greatly to making the data held in latch circuit 12 resistant to disturbance during read and write operations. This stability is true of all memory cells 10 sharing world lines or bit lines with the cell to be written.

In accordance with another feature and advantage of the present invention, the memory cell 10 is particularly and straightforwardly adaptable to multiple port access through the addition of more sense and/or write circuits 14, 14', 16, 16'.

Figure 2:
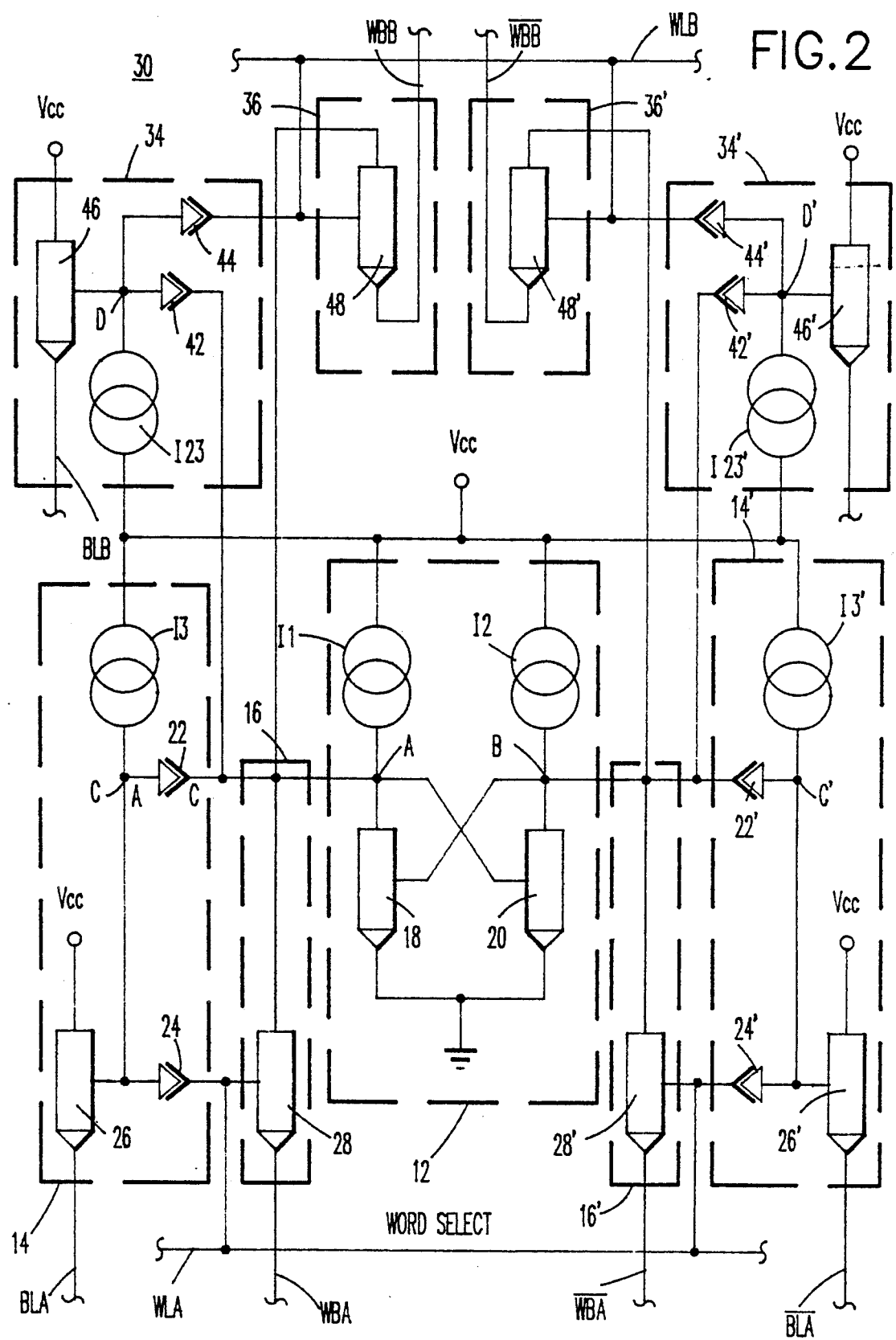
FIG. 2 shows the data memory cell of FIG. 1 further incorporating multiple read and write ports.

Referring now to FIG. 2, a memory cell 30 is shown including latch circuit 12, sense circuit 14, 14', and write circuit 16, 16' identical to the like numbered circuits of FIG. 1. In accordance with the multi-port capability of the present invention, memory cell 30 further includes additional sense circuit 34, 34' identical to sense circuit 14, 14', and additional write circuit 36, 36' identical to write circuit 16, 16'. Elements in these additional sense and write circuits corresponding to elements in the original sense and write circuits are indicated by like reference numbers incremented by 20.

Considering the unprimed portions of the additional circuits (the primed portions being identical in construction), sense circuit 34 includes a SBD 42 having a cathode connected to circuit node A, and an anode connected in common with the anode of a SBD 44 at a circuit node D. The cathode of SBD 44 is connected to a second word line WLB. A transistor 46 has a collector connected to supply voltage $V_{CC}$, a base connected to circuit node D, and an emitter available as a bit sense line BLB. A constant current source I23 is connected between supply voltage $V_{CC}$ and circuit node D.

Additional write circuit 36 includes a transistor 48 connected at its collector to circuit node A, at its base to the cathode of SBD 44, and at its emitter to a second write bit line WBB.

The operation of cell 30 is substantially identical to that of cell 10 above, with the exception that, in addition to sensing and/or writing of data through the use of word line WLA, data may also be sensed and/or written through the additional sense and write circuits via the use of word line WLB. More specifically, to sense data at bit sense lines BLB, BLB-bar, the WORD SELECT signal on word line WLB is set high, and current is pulled from the bit sense lines. To write data into memory cell 30 via write bit lines WBB, WBB-bar, the differential data is set on the write bit lines, and the WORD SELECT signal on word line WLB is set high so as to pull current selectively from circuit node A or B.

It will thus be appreciated that, through a replication of the sense and write circuits provided in memory cell 10 (FIG. 1), dual (multiple) sense and write ports are made available to latch circuit 12. It will also be appreciated that further such sense and write circuits can be provided and connected to latch circuit 12 in an identical manner so as to provide additional sense and/or write ports. It is not necessary that sense and write circuits be provided in equal number. The present invention can provide, for example, a single write port and multiple sense ports through the above-described replication and connection of the sense circuit.

There is thus provided a new and improved data memory cell for storing and writing differential data. The cell utilizes a single, bistable latch circuit which is operated with the on transistor in the saturation mode so as to provide exceptional resistance to disturbance, while also providing fast read and write times. The memory cell operates with small read, write, and control signals, and provides very fast recovery following read and write operations. The inventive memory cell requires relatively low power, and is particularly well suited to use in large scale memory arrays.

While the present invention has been shown and described with respect to specific embodiments, numerous variations, changes, and improvements will occur to those skilled in the art without departing from the spirit and scope of the invention.

What is claimed is:

1. A semiconductor memory cell responsive to a SELECT signal on a word line for outputting stored differential data signals, comprising:
   latching means for storing differential data, said latching means including a transistor pair having cross-coupled base-collector terminals connected to operate in a bistable mode such that the on transistor is saturated; and
   sensing means connected to each of the base-collector terminals in said transistor pair and responsive to said SELECT signal for sensing the stored differential data, said sensing means including
   (a) a first diode having a cathode connected to the base-collector terminal, and
   (b) a second diode having an anode connected to the anode of the first diode and a cathode connected to the word line;
   the stored differential data being sensed at the commonly connected anodes of said first and second diodes.

2. A semiconductor memory cell in accordance with claim 1 wherein said latching means further includes means for supplying a constant current to each of the base-collector terminals of said transistor pair.

3. A semiconductor memory cell in accordance with claim 2 wherein the emitter terminals of said transistor pair are connected to a fixed reference potential.

4. A semiconductor memory cell in accordance with claim 3 wherein said sensing means further includes means for supplying a constant current to the commonly connected anodes of said first and second diodes.

5. A semiconductor memory cell in accordance with claim 4 wherein each of said constant current means comprises a PNP transistor having an emitter connected to a supply voltage and a base connected to a reference voltage.

6. A semiconductor memory cell in accordance with claim 4 wherein said sensing means further includes a transistor connected at its base to the commonly connected anodes of said first and second diodes so as to amplify the signal sensed thereat.

7. A semiconductor memory cell in accordance with claim 1 wherein said semiconductor memory cell is further responsive to said SELECT signal applied to said word line for writing differential data into said latch means, said semiconductor memory cell further including writing means connected to each of the base-collector terminals in said transistor pair, said writing means including a transistor having a base connected to the cathode of said second diode and a collector connected to the base-collector terminal.

8. A semiconductor memory cell in accordance with claim 7 and further including a plurality of said sensing means and said writing means connected to said transistor pair, whereby multiple access ports are provided to said transistor pair.

9. A semiconductor memory cell in accordance with claim 1 and further including a plurality of said sensing means connected to said transistor pair, whereby multiple sensing ports are provided to said transistor pair.

10. A semiconductor memory cell for selectively storing or outputting differential signals responsive to a SELECT signal supplied on a word line, said memory cell comprising:
   a transistor pair having cross-coupled base-collector terminals and emitter terminals connected to a common reference potential;
   sensing means connected to each of the base-collector terminals in said transistor pair, each of said sensing means including
      (a) a first diode having a cathode connected to the base-collector terminal,
      (b) a second diode having an anode connected to the anode of said first diode and a cathode connected to said word line, and
      (c) means connected at the commonly connected anodes of said first and second diodes for amplifying the signal thereat;
   writing means connected to each of the base-collector terminals in said transistor pair, said writing means including a transistor having a base connected to said word line and a collector connected to the base-collector terminal; and
   means for supplying constant current to each of the base-collector terminals and to each of the commonly connected anodes of said first and second diodes.

11. A semiconductor memory cell in accordance with claim 10 and further including a plurality of said sensing means connected to each of the transistors in said transistor pair, whereby multiple read access ports are provided to said transistor pair.

12. A semiconductor memory cell in accordance with claim 10 and further including a plurality of said writing means connected to each of the transistors in said transistor pair, whereby multiple write access ports are provided to said transistor pair.

13. A semiconductor memory cell in accordance with claim 10 and further including a plurality of said writing and sensing means connected to each of the transistors in said transistor pair.

14. A semiconductor memory cell in accordance with claim 10 wherein:
   each of the transistors in said transistor pair comprises an NPN bipolar transistor; and
   each of said constant current providing means comprises a PNP bipolar transistor.

* * * * *